(12) United States Patent
Lai et al.

(10) Patent No.: US 9,973,214 B2
(45) Date of Patent: May 15, 2018

(54) LOW DENSITY PARITY CHECK DECODING METHOD PERFORMING ON GENERAL GRAPHIC PROCESSING UNIT AND DECODING APPARATUS

(71) Applicant: Winbond Electronics Corp., Taichung (TW)

(72) Inventors: Bo-Cheng Lai, Hualien County (TW); Tsou-Han Chiu, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 43 days.

(21) Appl. No.: 15/203,804

(22) Filed: Jul. 7, 2016

(65) Prior Publication Data
US 2017/0012643 A1    Jan. 12, 2017

(30) Foreign Application Priority Data
Jul. 9, 2015  (CN) .......................... 2015 1 0400004

(51) Int. Cl.
*H03M 13/11*  (2006.01)
*H03M 13/00*  (2006.01)
*G06T 1/20*  (2006.01)

(52) U.S. Cl.
CPC .... *H03M 13/1131* (2013.01); *H03M 13/1137* (2013.01); *H03M 13/616* (2013.01); *H03M 13/6527* (2013.01); *H03M 13/6566* (2013.01); *G06T 1/20* (2013.01); *G06T 2200/28* (2013.01)

(58) Field of Classification Search
CPC .............................................. H03M 13/1131
See application file for complete search history.

(56) References Cited

U.S. PATENT DOCUMENTS

| | | | |
|---|---|---|---|
| 7,886,208 B2 | 2/2011 | Moon et al. | |
| 8,429,483 B1 * | 4/2013 | Varnica | G06F 11/1048 714/752 |
| 8,566,668 B1 * | 10/2013 | Dave | H03M 13/1114 714/752 |
| 2003/0033575 A1 * | 2/2003 | Richardson | G06N 3/02 714/799 |
| 2004/0153960 A1 * | 8/2004 | Eroz | H03M 13/11 714/800 |

(Continued)

OTHER PUBLICATIONS

X. Wen et al., "A high throughput LDPC decoder using a mid-range GPU," 2014 IEEE International Conference on Acoustics, Speech and Signal Processing (ICASSP), Florence, 2014, pp. 7515-7519.*

(Continued)

*Primary Examiner* — Steve Nguyen
(74) *Attorney, Agent, or Firm* — JCIPRNET

(57) ABSTRACT

A low density parity check (LDPC) decoding method and a decoding apparatus are provided. The method includes following steps. Based on M edges of a Tanner graph related to a parity check matrix, each of the edges is associated with one of a plurality of threads, such that each of the threads is corresponding to one of a plurality of edge identifies. When executing one of the threads, data in a shared memory is accessed according to the edge identifier of the one of the threads, so as to update a plurality of passing massages respectively corresponding to the edges in the shared memory. Thereby, high computation parallelism and fully-coalesced data accesses can be achieved.

18 Claims, 5 Drawing Sheets

(56) References Cited

U.S. PATENT DOCUMENTS

| | | | |
|---|---|---|---|
| 2005/0005231 A1* | 1/2005 | Sun | H03M 13/1137 714/801 |
| 2006/0085720 A1* | 4/2006 | Tran | H03M 13/1117 714/758 |
| 2006/0107181 A1* | 5/2006 | Dave | H03M 13/1137 714/758 |
| 2008/0178066 A1* | 7/2008 | Kim | H03M 13/1111 714/807 |
| 2010/0064199 A1* | 3/2010 | Branco | H03M 13/1137 714/758 |
| 2012/0213307 A1* | 8/2012 | Perry | H04L 1/0007 375/285 |
| 2013/0212450 A1* | 8/2013 | Sham | H03M 13/1137 714/773 |

OTHER PUBLICATIONS

G. Wang, M. Wu, B. Yin and J. R. Cavallaro, "High throughput low latency LDPC decoding on GPU for SDR systems," 2013 IEEE Global Conference on Signal and Information Processing, Austin, TX, 2013, pp. 1258-1261.*

Y. Lin and W. Niu, "High Throughput LDPC Decoder on GPU," in IEEE Communications Letters, vol. 18, No. 2, pp. 344-347, Feb. 2014.*

B. Jiang, J. Bao and X. Xu, "Efficient simulation of QC LDPC decoding on GPU platform by CUDA," 2012 International Conference on Wireless Communications and Signal Processing (WCSP), Huangshan, 2012, pp. 1-5.*

S. Kang and J. Moon, "Parallel LDPC decoder implementation on GPU based on unbalanced memory coalescing," 2012 IEEE International Conference on Communications (ICC), Ottawa, ON, 2012, pp. 3692-3697.*

G. Wang, M. Wu, Y. Sun and J. R. Cavallaro, "GPU accelerated scalable parallel decoding of LDPC codes," 2011 Conference Record of the Forty Fifth Asilomar Conference on Signals, Systems and Computers (ASILOMAR), Pacific Grove, CA, 2011, pp. 2053-2057.*

* cited by examiner

LOW DENSITY PARITY CHECK DECODING METHOD PERFORMING ON GENERAL GRAPHIC PROCESSING UNIT AND DECODING APPARATUS

CROSS-REFERENCE TO RELATED APPLICATION

This application claims the priority benefit of China application serial no. 201510400004.3, filed on Jul. 9, 2015. The entirety of the above-mentioned patent application is hereby incorporated by reference herein and made a part of this specification.

BACKGROUND

Field of the Invention

The invention is directed to a parallel data processing technique and more particularly, to a low density parity check (LDPC) decoding method performed on a general-purpose computing on graphics processing unit (GPGPU) and a decoding apparatus thereof.

Description of Related Art

A low density parity check (LDPC) code is an error correction code that can achieve a performance level approximate to a Shannon channel limit, and thus, the LDPC code is widely applied in many currently available communication system standards, such as a WiFi system based on an IEEE 802.11n standard, an Ethernet based on an IEEE 802.3 standard, a WiMAX system based on an IEEE 802.16e standard or a digital video broadcasting-satellite transmission 2nd generation (DVB-S2). Even though the LDPC has a good channel error checking and correcting capability in channel encoding, a LDPC decoding process needs repeated iteration computation to obtain a decoding result. Therefore, during a decoding computation using a large-size parity check matrix, the LDPC decoding process requires supports of powerful hardware computing capability and huge hardware resources.

A general-purpose computing on graphics processing unit (GPGPU) executes general computing tasks which are originally processed by a central processor by using a graphics processing unit used for processing graphics, and these general computing tasks usually have no relation to the graphics processing. Furthermore, a GPGPU is a multi-core architecture and can provide powerful computation capability and a high throughput by means of simultaneously executing a huge amount of threads. It can be expected that performing the LDPC decoding operation on the GPGPU can significantly increase the decoding performance.

However, in a conventional method, a GPGPU typically only supports regular LDPC decoding. As for irregular LDPC decoding, the decoding performance is often limited by difficulty and complexity of designing data structures and memory accessing. Accordingly, technicians of the art are subject to develop a decoding architecture that can be applied in a wide range and improve the performance of the LDPC decoding performed by the GPGPU.

SUMMARY

Accordingly, the invention provides a low density parity check (LDPC) decoding method performed on a graphics processing unit (GPGPU) and a decoding apparatus thereof, which can obtain higher computation parallelism to enhance decoding performance and can support irregular LDPC decoding.

According to an exemplary embodiment of the invention, an LDPC decoding method performed on a GPGPU is provided. A streaming multiprocessor of the GPGPU includes a plurality of thread computing cores and a shared memory. The method includes the following steps. Based on M edges of a Tanner graph related to a parity check matrix, each of the edges is associated with one of a plurality of threads, such that each of the threads is corresponding to one of a plurality of edge identifiers. M is an integer greater than 1, and edges are connected between a plurality of check nodes and a plurality of bit nodes. When one of the threads is executed, data in the shared memory is accessed according to an edge identifier of the one of the threads, so as to update a plurality of passing massages which are respectively corresponding to the edges and stored in the shared memory.

In an exemplary embodiment of the invention, the step of accessing the data in the shared memory according to the edge identifier of the one of the threads, so as to update the passing massages respectively corresponding to the edges which are stored in the shared memory includes: reading at least one target fetch-point index from M fetch-point indexes according to the edge identifier of the one of the threads, and reading at least one first target passing message from M first-direction passing massages stored in the shared memory according to the at least one target fetch-point index.

In an exemplary embodiment of the invention, a fetch-point index array stored in the shared memory records the fetch-point indexes respectively corresponding to the edges, and a bit-to-check message array stored in the shared memory records the first-direction passing massages respectively corresponding to the edges.

In an exemplary embodiment of the invention, an array storage position of each of the fetch-point indexes in the fetch-point index array is determined according to a connection status of the Tanner graph, and the first-direction passing messages in the bit-to-check message array corresponding to the same check node are adjacently arranged.

In an exemplary embodiment of the invention, the step of reading the at least one target fetch-point index from the fetch-point indexes according to the edge identifier of the one of the threads, and reading the least one first target passing message from the first-direction passing messages stored in the shared memory according to the at least one target fetch-point index includes: starting to read the at least one target fetch-point index from an ith fetch-point index in the fetch-point index array according to the edge identifier of the one of the threads, wherein i is equal to the edge identifier of the one of the threads; starting to read the at least one first target passing message from a jth first-direction passing message in the bit-to-check message array according to the ith fetch-point index, wherein j is equal to the jib fetch-point index; and continuously reading the at least one first target passing message from the bit-to-check message array in response to the sequential and cyclical reading of the fetch-point index array and stopping reading the first-direction passing messages in the bit-to-check message array until one of the fetch-point indexes meeting a predetermined condition is read. The one of the fetch-point indexes meeting the predetermined condition is equal to the edge identifier of the one of the threads.

In an exemplary embodiment of the invention, the step of accessing the data in the shared memory according to the edge identifier of the one of the threads, so as to update the passing massages respectively corresponding to the edges which are stored in the shared memory further includes: reading a target position index from M position indexes according to the edge identifier of the one of the threads, and updating a second target passing message among M second-direction passing messages by using the target position index and the at least one first target passing message. The target position index is configured to indicate an array storage position of the second target passing message.

In an exemplary embodiment of the invention, a position index array records the position indexes respectively corresponding to the edges, and a check-to-bit message array records the second-direction passing messages respectively corresponding to the edges.

In an exemplary embodiment of the invention, an array storage position of each of the position indexes in the position index array is determined according to a connection status of the Tanner graph, and the second-direction passing messages in the check-to-bit message array corresponding to the same bit node are adjacently arranged.

In an exemplary embodiment of the invention, the step of reading the target position index from the position indexes according to the edge identifier of the one of the threads includes: reading an ith position index from the position index array according to the edge identifier of the one of the threads to serve as the target position index, wherein i is equal to the edge identifier of the one of the threads.

In an exemplary embodiment of the invention, the step of updating the second target passing message among the second-direction passing messages by using the target position index and the at least one first target passing message includes: computing an updated message according to the at least one first target passing message, and substituting the updated message for a kth second-direction passing message pointed by the target position index in the check-to-bit message array, so as to update the second target passing message, wherein k is equal to the target position index.

According to an exemplary embodiment of the invention, a decoding apparatus including a GPGPU and a storage unit is provided. The GPGPU includes a plurality of streaming multiprocessors, and each of the streaming multiprocessors includes a plurality of thread computing cores and a shared memory. The storage unit is coupled to the GPGPU and stores a plurality of instructions. The GPGPU executes the instructions to, based on M edges of a Tanner graph related to a parity check matrix, associate each of the edges with one of a plurality of threads, such that each of the threads is corresponding to one of a plurality of edge identifiers, wherein M is an integer greater than 1, and the edges are connected between a plurality of check nodes and a plurality of bit nodes; and when executing one of the threads, access data in the shared memory according to an edge identifier of the one of the threads, so as to update a plurality of passing massages which are respectively corresponding to the edges and stored in the shared memory.

To sum up, each of the edges in the Tanner graph is associated with one of the threads, such that the GPGPU can achieve parallelization of processing the update computation on the passing messages during the LDPC decoding process. The plurality of thread computing cores of the GPGPU can read a fetch-point index array to read the first-direction passing messages in the bit-to-check message array. In other words, each of the thread computing cores can access the data in the shared memory according to the edge identifier of each of the threads, so as to update the passing message stored in shared memory and respectively corresponding to the edges. In this way, in comparison with the decoding method of the related art where the data nodes (including the bit nodes and the check nodes) are assigned to different threads for the iteration computation, the invention can achieve higher computation parallelism. In addition, the data processing method performed based on the edges in the Tanner graph of the invention can simultaneously support decoding operations using regular and irregular LDPC codes.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Based on a characteristic that a number of edges on a Tanner graph is greater than a number of nodes, the invention proposes an edge-based computation processing architecture. In comparison with the conventional node-based computation processing method performed on a general-purpose computing on graphics processing units (GPGPU), the invention can upgrade decoding performance by increasing computation parallelism of performing a low density parity check (LDPC) operation on the GPGPU.

Figure 1:
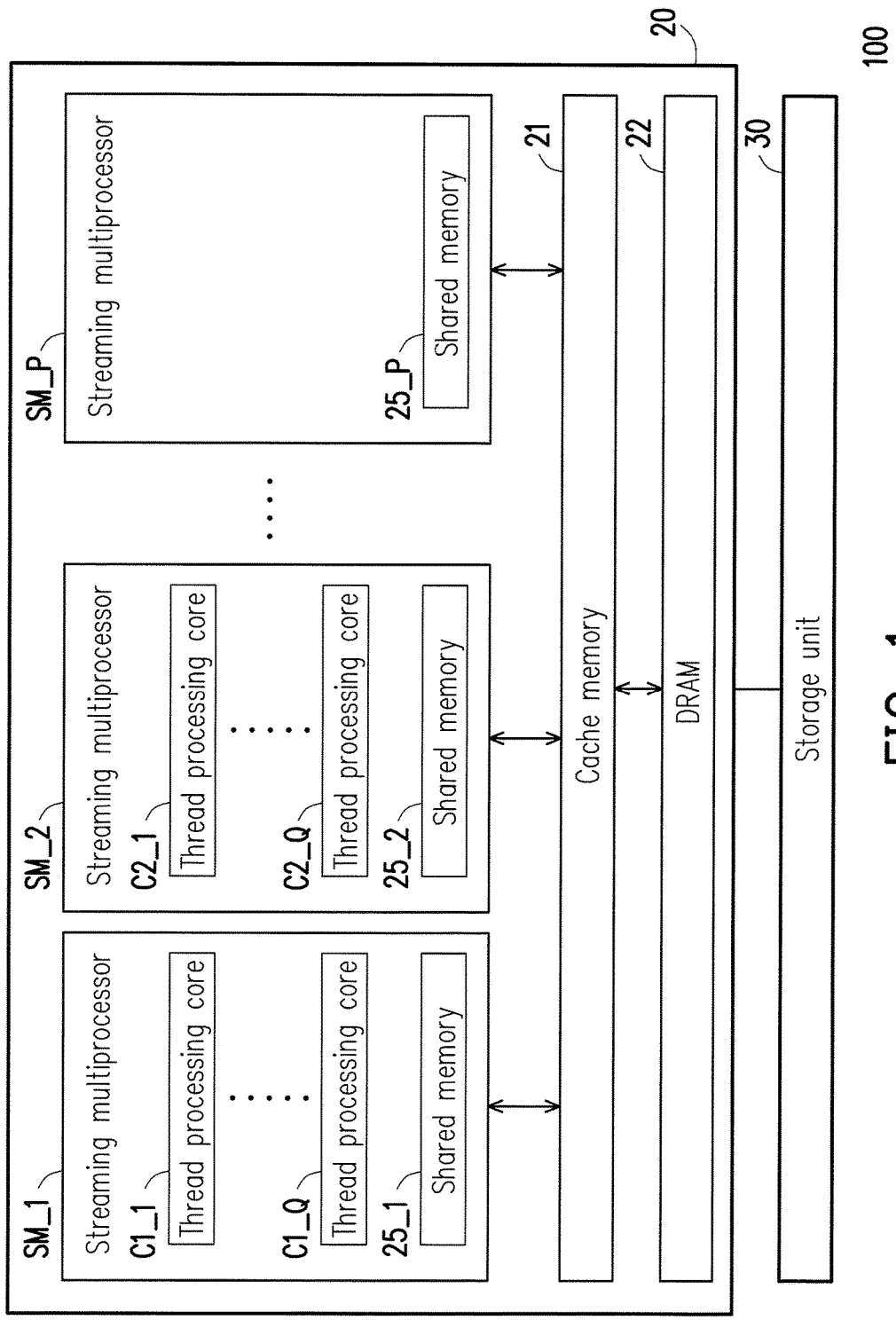
FIG. 1 is a schematic diagram illustrating a decoding apparatus according to an exemplary embodiment of the invention.

FIG. 1 is a schematic diagram illustrating a decoding apparatus according to an exemplary embodiment of the invention. A decoding apparatus 100 may be configured in a wireless communication receiving device (e.g., a receiver using the IEEE 802.11n standard), but the invention is not limited thereto. When the decoding apparatus 100 receives data from a communication channel, the decoding apparatus 100 may perform a decoding function based on a LDPC algorithm, so as to perform a calibration procedure on the data received from the communication channel. In the present exemplary embodiment, the decoding apparatus 100 includes a GPGPU 20 and a storage unit 30.

In the present exemplary embodiment, the GPGPU 20 includes a plurality of streaming multiprocessors SM_1 to SM_P (P is a positive integer), a cache memory 21 and a dynamic random access memory (DRAM) 22. Each of the streaming multiprocessors SM_1 to SM_P is configured to process a plurality of threads, and the streaming multiprocessors SM_1 to SM_P respectively include shared memories 25_1 to 25_P. Besides, each of the streaming multiprocessors SM_1 to SM_P includes a plurality of thread computing cores, and the thread computing cores belonging to the same streaming multiprocessor may communicate with one another or perform data transmission through the shared memory. For instance, the streaming multiprocessor SM_1 includes thread computing cores C1_1 to C1_Q, and the thread computing cores C1_1 to C1_Q may jointly access the shared memory 25_1. Similarly, the streaming multiprocessor SM_2 includes thread computing cores C2_1 to C2_Q, and the thread computing cores C2_1 to C2_Q may jointly access the shared memory 25_2.

Additionally, the streaming multiprocessors SM_1 to SM_P may also include other elements, such as thread warp schedulers, which are not illustrated in FIG. 1 though, but the invention is not limited thereto. Besides, the streaming multiprocessors SM_1 to SM_P may share the cache memory 21 for data transmission among the threads. The thread computing cores in each of the streaming multiprocessors SM_1 to SM_P are configured to execute in parallel a large number of threads. In the present exemplary embodiment, the GPGPU 20 may process in parallel a large number of threads according to the same instruction by using a single-instruction multiple thread (SIMT).

The storage unit 30 is, for example, an arbitrary type of fixed or removable random access memory (RAM), a read-only memory (ROM), a flash memory, a hard disk drive or any other similar element or a combination of these elements, but the invention is not limited thereto. The storage unit 30 is coupled to the GPGPU 20 and stores a plurality of instructions, and the GPGPU 20 executes the instructions to provide the LDPC decoding function.

In the present exemplary embodiment, the GPGPU 20 executes the instructions to perform the following steps. Based on M edges of a Tanner graph related to a parity check matrix, each of the edges is associated with one of a plurality of threads, such that each of the threads is corresponding to one of a plurality of edge identifiers. When one of the threads is being executed, data in a shared memory is accessed according to an edge identifier of the one of the threads, so as to update a plurality of passing massages which are respectively corresponding to the edges and stored in the shared memory.

Figures 2A, 2B:
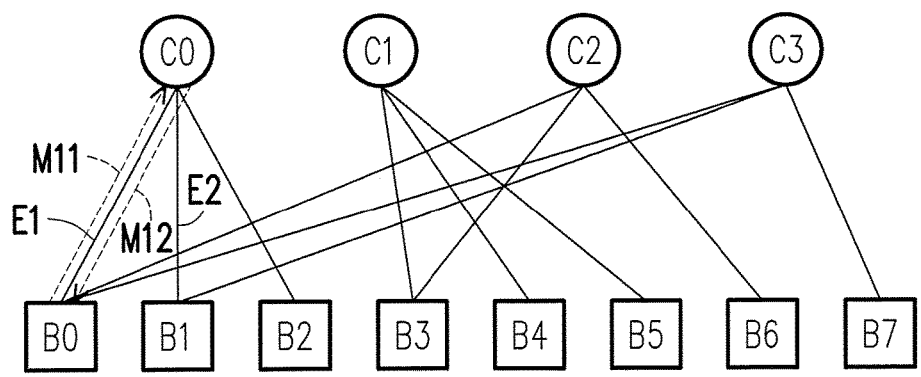
FIG. 2A is a schematic diagram illustrating a parity check matrix.
FIG. 2B is a schematic diagram illustrating a relation between bit nodes and check nodes in the parity check matrix.

The LDPC decoding method of the invention will be described in detail below. FIG. 2A is a schematic diagram illustrating a parity check matrix, and FIG. 2B is a schematic diagram illustrating a relation between bit nodes and check nodes in the parity check matrix. Referring to FIG. 2A, 8 rows of a parity check matrix 210 are respectively corresponding to bit nodes B0, B1, B2, B3, B4, B5, B6 and B7, 4 columns of the parity check matrix 210 are respectively corresponding to check nodes C0, C1, C2 and C3. In an LDPC decoding process, a matrix multiplication operation is performed on probability information and the parity check matrix 210 to obtain a decoding result.

Referring to FIG. 2B, the parity check matrix 210 generally may be expressed as a Tanner graph, and the Tanner graph also includes the bit nodes B0 to B7 and the check nodes C0 to C3. Referring to FIG. 2B, there are edges between the bit nodes B0 to B7 and the check nodes C0 to C3 (i.e., there are connection lines between the bit nodes and the check nodes), such that the bit nodes and the check nodes take turns for computation. For instance, the bit node B0 is connected with the check node C0 through an edge E1. After the bit nodes B0 to B7 and the check nodes C0 to C3 which are corresponding to each other as shown in FIG. 2B (which are connected with each other as shown in FIG. 2B), respective computation results thereof are temporarily stored in the same memory unit or memory position.

In the present exemplary embodiment, the GPGPU 20 performs a LDPC decoding procedure according to a connection status of the Tanner graph. The LDPC decoding procedure includes a horizontal decoding procedure and a vertical decoding procedure. Specifically, in the horizontal decoding procedure, the GPGPU 20 computes passing messages delivered from the check nodes C0 to C3 toward the bit nodes B0 to B7. In the vertical decoding procedure, the GPGPU 20 computes the passing messages delivered from the bit nodes B0 to B7 toward the check nodes C0 to C3. The passing messages are propagated along the edges in the Tanner graph. For example, based on the connection through the edge E1, a passing message M12 is propagated from the check node C0 to the bit node B0, while a passing message M11 is propagated from the bit node B0 to the check node C0.

Based on the description related to the LDPC decoding flow, during the decoding process, the GPGPU 20 needs two arrays to respectively store a plurality of first-direction passing messages and a plurality of second-direction passing messages, so as to perform iteration computation by using the passing messages based on a decoding algorithm. For example, the GPGPU 20 may utilize a sum-product algorithm, a min-sum algorithm, or a bit-flipping algorithm, but the invention is not intent to limit the use of the algorithm.

It should be noted that in the exemplary embodiments of the invention, the first-direction passing messages are propagated from the bit nodes to the check nodes and thus, may also be referred to as bit-to-check massages, while the second-direction passing messages are propagated from the check nodes to the bit nodes and thus, may also be referred to as check-to-bit massages. In addition, an array storing the first-direction passing messages is referred to as a bit-to-check message array, and an array storing the second-direction passing messages is referred to as a check-to-bit array. It is to be mentioned that in the exemplary embodiments of the invention, the computation of the passing messages respectively related to the edges are respectively corresponding to different threads. Accordingly, if the LDPC decoding is executed by using the GPGPU 20 illustrated in FIG. 1, each of the thread computing cores of the GPGPU 20 may compute the passing messages on different edges.

Figure 3:
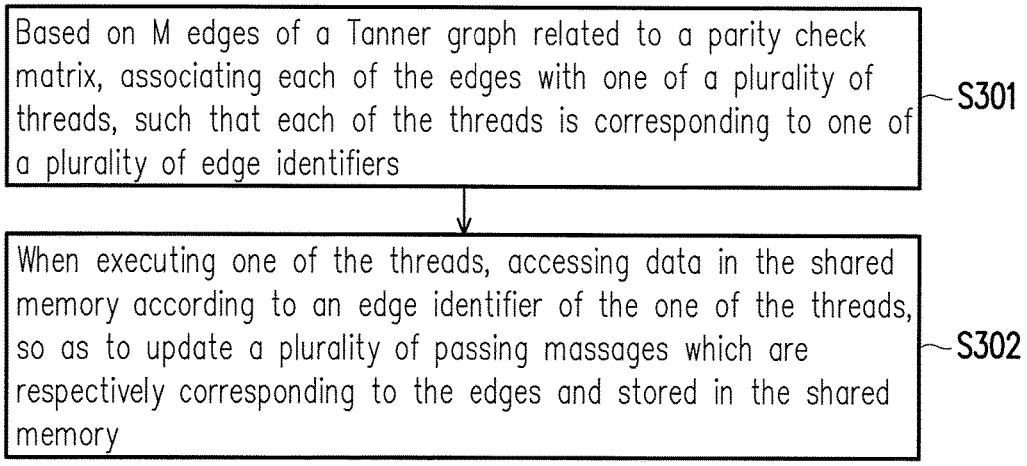
FIG. 3 is a flowchart illustrating a low density parity check (LDPC) decoding method according to an exemplary embodiment of the invention.

FIG. 3 is a flowchart illustrating a LDPC decoding method according to an exemplary embodiment of the invention. In the present exemplary embodiment, the LDPC decoding method is applicable to the decoding apparatus 100 illustrated in FIG. 1, but the invention is not limited thereto. Referring to FIG. 3, in step S301, based on M edges in a Tanner graph related to a parity check matrix, each edge is associated with one of a plurality of threads, such that each of the threads is corresponding to one of a plurality of edge identifiers. M is an integer greater than 1, and the edges are connected between a plurality of check nodes and a plurality of bit nodes. In other words, the passing message computation related to each edge is assigned to different threads. Taking the Tanner graph illustrated in FIG. 2B as an example, there are 12 edges between the check nodes C0 to C3 and the bit nodes B0 to B7. The computation of the passing messages (including the first-direction passing messages and the second-direction passing messages) on the 12 edges are respectively performed by different thread computing cores executing different threads simultaneously. For example, during a horizontal decoding process, updated computation of the second-direction passing messages are respectively corresponding to the 12 different threads, and each of the 12 threads has an edge identifier.

Then, in step S302, when one of the threads is executed, the data in the shared memory is accessed according to the edge identifier of the one of the threads, so as to update the passing messages stored in the shared memory which are respectively corresponding to the edges. Specifically, during the horizontal decoding process, each of the thread computing cores may read at least one first-direction passing message required for updating one of the second-direction passing messages according to the edge identifier of the thread.

Figure 4:
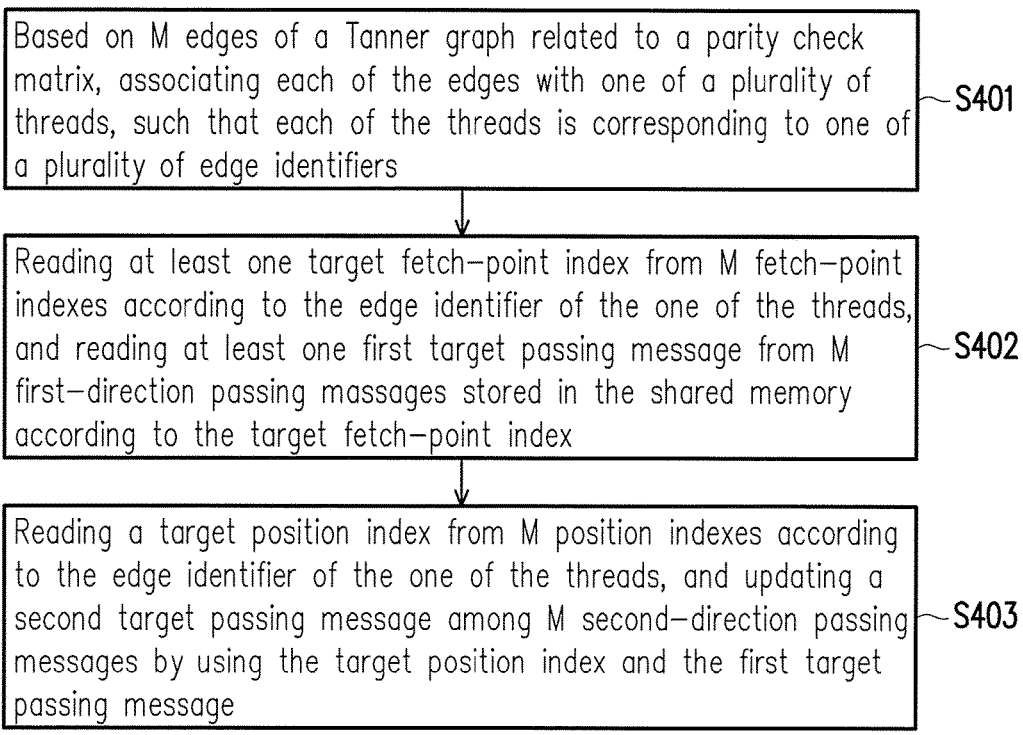
FIG. 4 is a flowchart illustrating an LDPC decoding method according to an exemplary embodiment of the invention.

For detailed description of the invention, another exemplary embodiment will be provided to describe in detail how to access at least one adaptive passing message for the update computation according to the edge identifier of the thread. FIG. 4 is a flowchart illustrating an LDPC decoding method according to an exemplary embodiment of the invention. In the present exemplary embodiment, the LDPC decoding method is applicable to the decoding apparatus 100 illustrated in FIG. 1, but the invention is not limited thereto.

Referring to FIG. 4, in step S401, based on M edges in a Tanner graph related to a parity check matrix, each edge is associated with one of a plurality of threads, such that each of the threads is corresponding to one of a plurality of edge identifiers. Then, in step S402, at least one target fetch-point index is read from M fetch-point indexes according to an edge identifier of one of the threads, and at least one first target passing message is read from M first-direction passing massages stored in the shared memory according to the at least one target fetch-point index.

In the present exemplary embodiment, a fetch-point index array stored in the shared memory records fetch-point indexes respectively corresponding to the edges, and a bit-to-check message array stored in the shared memory records first-direction passing messages respectively corresponding to the edges. Each of the fetch-point indexes is configured to indicate an array storage position of an element being read in the bit-to-check message array by the thread computing core. It should be specially noted that the array storage position of each fetch-point index in the fetch-point index array is determined according to according to a connection status of the Tanner graph, and the first-direction passing messages in the bit-to-check message array corresponding to the same check node are adjacently arranged. Based on the configuration of the fetch-point index array and the arrangement of the array storage positions of the fetch-point indexes, each thread may read the passing message required by a specific edge from the bit-to-check message array.

To be more detailed, according to the edge identifier of the one of the threads, the thread computing core may start to read the at least one target fetch-point index from an ith fetch-point index in the fetch-point index array, where i is equal to the edge identifier of the one of the threads. For instance, if the edge identifier of the thread is '1', the thread computing core may start to read the target fetch-point indexes from the $1^{st}$ fetch-point index in the fetch-point index array, in which the edge identifier is an integer. Then, according to the ith fetch-point index, the thread computing core may start to read the at least one first target passing messages from a jth first-direction passing message in the bit-to-check message array, where j is equal to the ith fetch-point index. Then, the thread computing core may start to read the first target passing messages from the jth first-direction passing message in the bit-to-check message array.

The thread computing core continuously may read the first target passing messages from the bit-to-check message array in response to the sequential and cyclical reading of the fetch-point index array, and stop reading the first-direction passing messages from the bit-to-check message array until one of the fetch-point indexes meeting a predetermined condition is read. The fetch-point index meeting the predetermined condition is equal to the edge identifier of the one of the threads. For example, when the fetch-point index read by the thread computing core executing the thread having the edge identifier of '1' is '1', the thread computing core stops continuously reading the fetch-point index array and simultaneously stops reading the first-direction passing messages. In this way, when one of the threads is executed, each of the threads computing the second-direction passing message of each edge may read the correct first-direction passing message.

Returning to the flow illustrated in FIG. 4, in step S403, according to the edge identifier of the one of the threads, a target position index is read from M position indexes, and a second target passing message among M second-direction passing messages is updated by using the target position index and the first target passing messages. The target position index indicates an array storage position of the second target passing message.

In the present exemplary embodiment, a position index array records the position indexes respectively corresponding to the edges, and a check-to-bit message array records the second-direction passing messages respectively corresponding to the edges. In addition, an array storage position of each of the position indexes in the position index array is determined according to the connection status of the Tanner graph, and the second-direction passing messages in the check-to-bit message array corresponding to the same bit node are adjacently arranged. Based on the configuration of the position index array and the arrangement of the array storage position of the position indexes, each thread may write the computed and updated passing messages into correct array storage positions to complete the update operation of the second-direction passing messages.

To be more detailed, according to the edge identifier of the one of the threads, the thread computing core may read an ith position index from the position index array to serve as the target position index, where i is equal to the edge identifier of the one of the threads. For instance, if it is assumed that the edge identifier of the thread is '1', the thread computing cores may read the $1^{st}$ position index in the position index array to serve as the target position index. The edge identifier is an integer. Then, the thread computing cores compute an updated message according to the first target passing messages and substitute the updated message for a kth second-direction passing message pointed by the target position index in the check-to-bit message array, so as to update the second target passing message, where k is equal to the target position index.

It should be mentioned that an LDPC code is commonly described by using a parity check matrix, the number of '1' per row of the parity check matrix is referred to as a row weight of the row, and the number of '1' per column is referred to as a column weight of the column. An LDPC code described by a corresponding parity check matrix of which the row weight and the column weight are the same is referred to a regular LDPC code (whose parity check matrix is regular), or otherwise referred to as an irregular LDPC code (whose parity check matrix is irregular). Since the LDPC decoding is based on edges for parallelization in the invention, the LDPC decoding method of the invention is applicable to regular and irregular LDPC codes, without reducing decoding performance in irregular LDPC decoding.

In comparison with the node-based design architecture, the invention provides an edge-based architecture, in which each single thread is in charge of the passing message update operation of each single edge on the Tanner graph. Thereby, the number of the edges in the Tanner graph is usually greater than the number of the nodes, thus, computation parallelism of the LDPC decoding method of the invention can be enhanced, so as to improve the decoding performance. Based on the description above, the edge-based process flow of the invention needs 4 arrays, which are the fetch-point index array, the bit-to-check message array, the position index array, and the check-to-bit array, respectively. The fetch-point index array is configured to control each thread to access the correct first target passing messages from the first-direction passing messages in the bit-to-check message array. Each thread continuously reads the at least one first target passing message from the bit-to-check message array, until the fetch-point index of the edge identifier of itself is read.

Figure 5A:
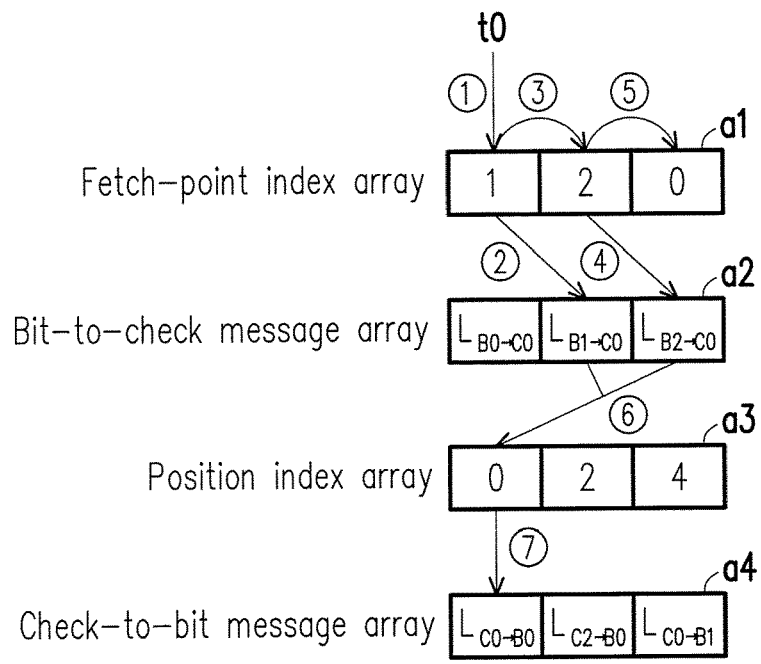
FIG. 5A is a schematic diagram illustrating an example of a data structure and a data access flow of threads according to an exemplary embodiment of the invention.
Figure 5B:
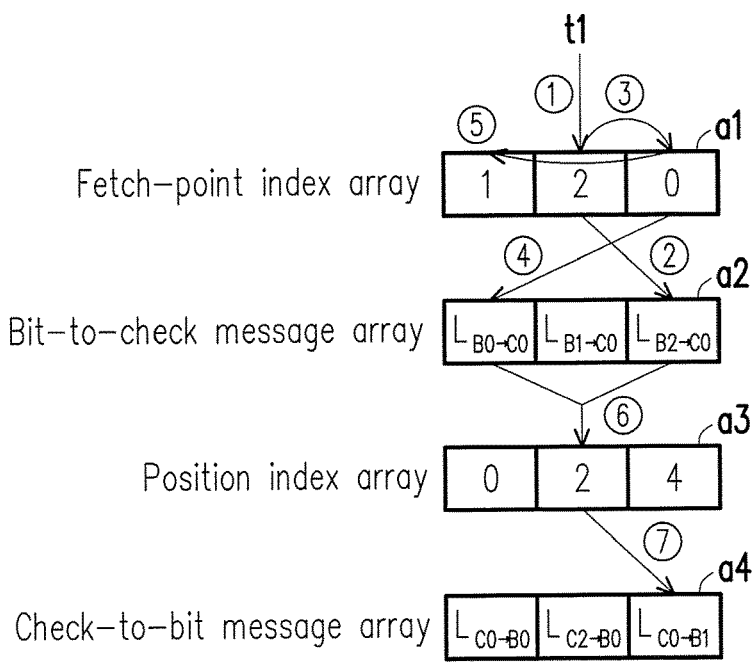
FIG. 5B is a schematic diagram illustrating an example of a data structure and a data access flow of threads according to an exemplary embodiment of the invention.

FIG. 5A and FIG. 5B are schematic diagrams respectively illustrating examples of data structures and data access flows of threads according to exemplary embodiments of the invention. It should be noted that FIG. 5A and FIG. 5B use the Tanner graph in FIG. 2B as an example for description, but the invention is not limited thereto. Referring to FIG. 5A, first, a thread t0 is configured for updating and computing the passing messages on the edge E1, and an edge identifier of the thread t0 is '0'. In step ① based on the edge identifier '0', the thread t0 reads a fetch-point index '1' having an array storage position corresponding to the edge identifier '0' from a fetch-point index array a1. In step ②, based on the fetch-point index '1', the thread t0 reads a first-direction passing message $L_{B1 \to C0}$ having an array storage position corresponding to the fetch-point index '1' from a bit-to-check message array a2.

Then, in step ③, the thread t0 continues to read a fetch-point index '2' following the fetch-point index '1' from the fetch-point index array a1. In step ④, based on the fetch-point index '2', the thread t0 reads a first-direction passing message $L_{B2 \to C0}$ having an array storage position corresponding to the fetch-point index '2' from the bit-to-check message array a2. In step ⑤, the thread t0 continues to read from the fetch-point index array a1 sequentially until a fetch-point index '0' is read. In step ⑥, the thread t0 compute an updated message by using the first-direction passing message $L_{B1 \to C0}$ and the first-direction passing message $L_{B2 \to C0}$, and read a target position index '0' from a position index array a3 according to its edge identifier '0'. In step ⑦, the thread t0 writes the updated message to the array storage position to substitute for a second-direction passing message corresponding to the target position index '0', so as to obtain an updated second-direction passing message $L_{C0 \to B0}$.

Similarly, FIG. 5B illustrates a flow of a thread t1 computing a second-direction passing message $L_{C0 \to B1}$. Referring to FIG. 2B and FIG. 5B, the thread t1 is configured for updating and computing the passing messages on the edge E2, and an edge identifier of the thread t1 is '1'. The thread t1 may obtain an updated second-direction passing messages $L_{C0 \to B4}$ according to the computation and the data access flow illustrated from steps ① to ⑦. The computation flow of the thread t1 may be derived by the technicians of the art according the content above and the description related to FIG. 5A and thus, will not be repeated.

Figure 6:
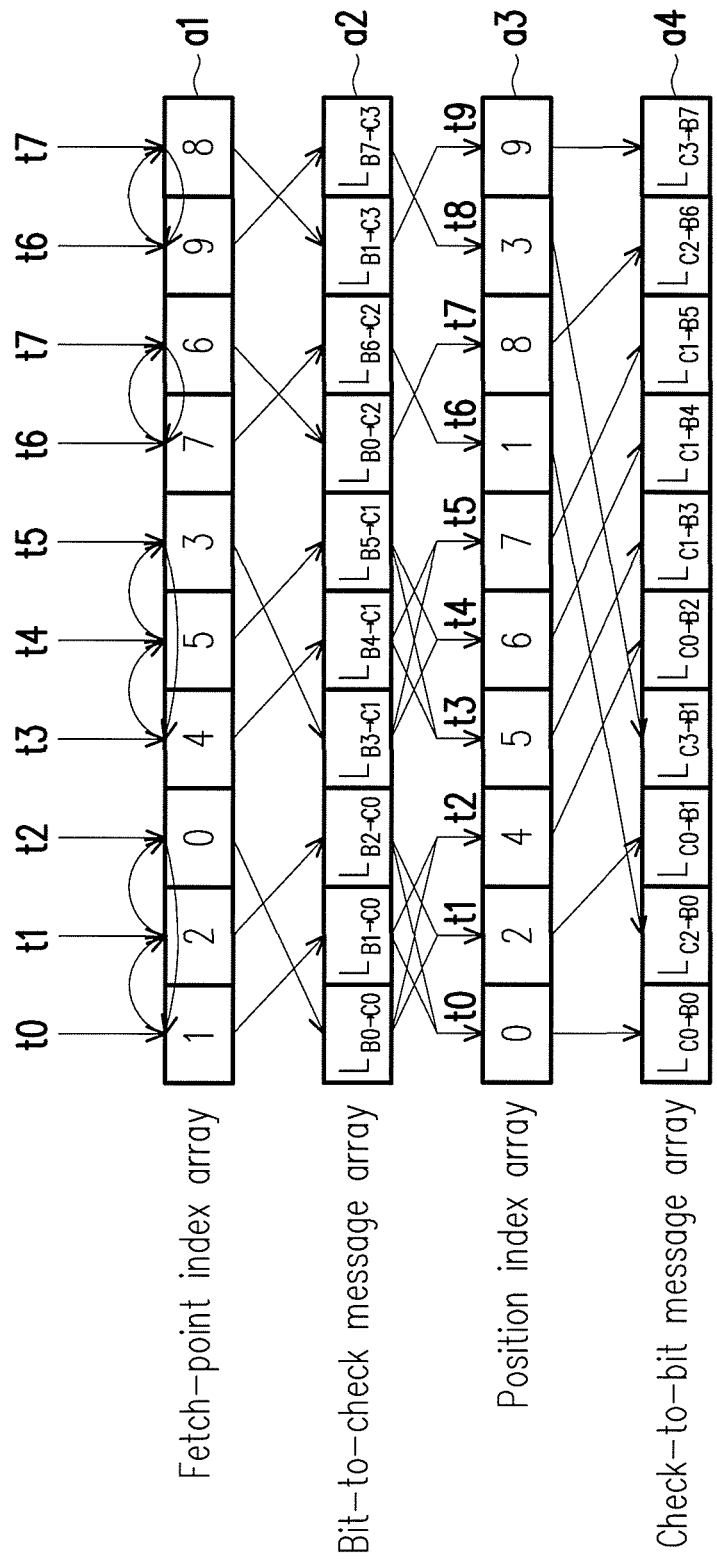
FIG. 6 is a schematic diagram illustrating an example of a data structure and a data access flow of threads according to an exemplary embodiment of the invention.

FIG. 6 is a schematic diagram illustrating an example of a data structure and a data access flow of threads according to an exemplary embodiment of the invention. It be noted that FIG. 6 use the Tanner graph in FIG. 2B as an example for description, but the invention is not limited thereto. Referring to FIG. 6, threads t0 to t9 are respectively configured for updating and computing the passing message on the edges in the Tanner graph illustrated in FIG. 2B, and edge identifiers of the threads t0 to t9 are '0' to '9', respectively. According to the node connection status in the Tanner graph depicted in FIG. 2B, fetch-point indexes are arranged to be recorded in the fetch-point index array a1, and position indexes are arranged to be recorded in the position index array a3, as shown in FIG. 6. FIG. 6 illustrates data access flows of all the threads t0 to t9. The computation flows of the threads t0 to t9 may be derived by the technicians of the art according the content above and the description related to FIG. 5A and thus, will not be repeated.

It is to be mentioned that according to the data access flows illustrated in FIG. 6, as for the parallelization of a plurality of threads, the access operations of the fetch-point index array, the bit-to-check message array, and the position index array in the memory are coalesced, and such a memory access coalescing phenomenon can contribute to demonstrating advantages of performing the LDPC decoding method of the invention by using the GPGPU. Especially, in an exemplary embodiment, the fetch-point index array and the bit-to-check message array are adaptive to be stored in an L1 cache memory of the streaming multiprocessors. In other words, the invention can facilitate in enhancing the performance of performing the LDPC decoding method on the GPGPU.

To summarize, in the invention, each of the edges in the Tanner graph is associated with one of the threads, such that the GPGPU can achieve parallelization of processing the update computation on the passing messages during the LDPC decoding process. In comparison with the decoding method of the related art where the data nodes (including the bit nodes and the check nodes) are assigned to different threads for the iteration computation, the invention can achieve higher computation parallelism. In addition, the data processing method performed based on the edges in the Tanner graph of the invention can simultaneously support decoding operations using regular and irregular LDPC codes. Moreover, based on the configuration of the fetch-point index array and the position index array, the invention can achieve memory accessing coalescing and repeated accessing of massive data, without rearranging the passing messages, so as to shorten data reacting time when the LDPC decoding method is performed on the GPGPU.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A low density parity check (LDPC) decoding method performed on a general-purpose computing on graphics processing unit (GPGPU) for irregular LDPC decoding, wherein a streaming multiprocessor of the GPGPU comprises a plurality of thread computing cores and a shared memory, the method comprising:
   based on M edges of a Tanner graph related to a parity check matrix, associating each of the edges with a different one of a plurality of threads executed in parallel by the thread computing cores of the GPGPU, such that each of the threads is corresponding to one of a plurality of edge identifiers, wherein M is an integer greater than 1, and the edges are connected between a plurality of check nodes and a plurality of bit nodes; and
   when executing one of the threads by one of the thread computing cores, accessing data in the shared memory according to an edge identifier of the one of the threads, so as to update a plurality of passing messages which are respectively corresponding to the edges and stored in the shared memory,
   wherein the step of accessing the data in the shared memory according to the edge identifier of the one of the threads, so as to update the passing messages which are respectively corresponding to the edges and stored in the shared memory comprises:
   reading a target position index from M position indexes according to the edge identifier of the one of the threads, and updating a second target passing message among M second-direction passing messages by using the target position index and at least one first target passing message among M first-direction passing messages stored in the shared memory, wherein the target position index is configured to indicate an array storage position of the second target passing message.

2. The LDPC decoding method according to claim 1, wherein the step of accessing the data in the shared memory according to the edge identifier of the one of the threads, so as to update the passing messages which are respectively corresponding to the edges and stored in the shared memory further comprises:
   reading at least one target fetch-point index from M fetch-point indexes according to the edge identifier of the one of the threads, and reading at least one first target passing message from the M first-direction passing messages stored in the shared memory according to the at least one target fetch-point index.

3. The LDPC decoding method according to claim 2, wherein a fetch-point index array stored in the shared memory records the fetch-point indexes respectively corresponding to the edges, and a bit-to-check message array stored in the shared memory records the first-direction passing messages respectively corresponding to the edges.

4. The LDPC decoding method according to claim 3, wherein an array storage position of each of the fetch-point indexes in the fetch-point index array is determined according to a connection status of the Tanner graph, and the first-direction passing messages in the bit-to-check message array corresponding to the same check node are adjacently arranged.

5. The LDPC decoding method according to claim 3, wherein the step of reading the at least one target fetch-point index from the fetch-point indexes according to the edge identifier of the one of the threads, and reading the least one first target passing message from the first-direction passing messages stored in the shared memory according to the at least one target fetch-point index comprises:
   starting to read the at least one target fetch-point index from an ith fetch-point index in the fetch-point index array according to the edge identifier of the one of the threads, wherein i is equal to the edge identifier of the one of the threads;
   starting to read the at least one first target passing message from a jth first-direction passing message in the bit-to-check message array according to the ith fetch-point index, wherein j is equal to the ith fetch-point index; and
   continuously reading the at least one first target passing message from the bit-to-check message array in response to the sequential and cyclical reading of the fetch-point index array and stopping reading the first-direction passing messages in the bit-to-check message array until one of the fetch-point indexes meeting a predetermined condition is read,
   wherein one of the fetch-point indexes is equal to the edge identifier of one of the threads.

6. The LDPC decoding method according to claim 1, wherein a position index array records the position indexes respectively corresponding to the edges, and a check-to-bit message array records the second-direction passing messages respectively corresponding to the edges.

7. The LDPC decoding method according to claim 6, wherein an array storage position of each of the position indexes in the position index array is determined according to a connection status of the Tanner graph, and the second-direction passing messages in the check-to-bit message array corresponding to the same bit node are adjacently arranged.

8. The LDPC decoding method according to claim 6, wherein the step of reading the target position index from the position indexes according to the edge identifier of the one of the threads comprises:
   reading an ith position index from the position index array according to the edge identifier of the one of the threads to serve as the target position index, wherein i is equal to the edge identifier of the one of the threads.

9. The LDPC decoding method according to claim 6, wherein the step of updating the second target passing message among the second-direction passing messages by using the target position index and the at least one first target passing message comprises:
   computing an updated message according to the at least one first target passing message, and substituting the updated message for a kth second-direction passing message pointed by the target position index in the check-to-bit message array, so as to update the second target passing message, wherein k is equal to the target position index.

10. A decoding apparatus for irregular LDPC decoding, comprising:
   a general-purpose computing on graphics processing unit (GPGPU), comprising a plurality of streaming multiprocessors, wherein each of the streaming multiprocessors comprises a plurality of thread computing cores and a shared memory; and
   a storage unit, coupled to the GPGPU and storing a plurality of instructions, wherein the GPGPU executes the instructions to:
   based on M edges of a Tanner graph related to a parity check matrix, associate each of the edges with a different one of a plurality of threads executed in parallel by the thread computing cores of the GPGPU, such that each of the threads is corresponding to one of a plurality of edge identifiers, wherein M is an integer greater than 1, and the edges are connected between a plurality of check nodes and a plurality of bit nodes; and when executing one of the threads by one of the thread computing cores, access data in the shared memory according to an edge identifier of the one of the threads, so as to update a plurality of passing messages which are respectively corresponding to the edges and stored in the shared memory;

wherein the GPGPU executes the instructions to read a target position index from M position indexes according to the edge identifier of the one of the threads; and update a second target passing message among M second-direction passing messages by using the target position index and at least one first target passing message among M first-direction passing messages stored in the shared memory, wherein the target position index is configured to indicate an array storage position of the second target passing message.

11. The decoding apparatus according to claim 10, wherein the GPGPU executes the instructions to:

read at least one target fetch-point index from M fetch-point indexes according to the edge identifier of the one of the threads, and read at least one first target passing message from the M first-direction passing messages stored in the shared memory according to the at least one target fetch-point index.

12. The decoding apparatus according to claim 11, wherein a fetch-point index array stored in the shared memory records the fetch-point indexes respectively corresponding to the edges, and a bit-to-check message array stored in the shared memory records the first-direction passing messages respectively corresponding to the edges.

13. The decoding apparatus according to claim 12, wherein an array storage position of each of the fetch-point indexes in the fetch-point index array is determined according to a connection status of the Tanner graph, and the first-direction passing messages in the bit-to-check message array corresponding to the same check node are adjacently arranged.

14. The decoding apparatus according to claim 12, wherein the GPGPU executes the instructions to:

start to read the at least one target fetch-point index from an ith fetch-point index in the fetch-point index array according to the edge identifier of the one of the threads, wherein i is equal to the edge identifier of the one of the threads;

start to read the at least one first target passing message from a jth first-direction passing message in the bit-to-check message array according to the ith fetch-point index, wherein j is equal to the ith fetch-point index; and continuously read the at least one first target passing message from the bit-to-check message array in response to the sequential and cyclical reading of the fetch-point index array and stop reading the first-direction passing messages in the bit-to-check message array until one of the fetch-point indexes meeting a predetermined condition is read, wherein one of the fetch-point indexes is equal to the edge identifier of one of the threads.

15. The decoding apparatus according to claim 11, further comprising a position index array recording the position indexes respectively corresponding to the edges, and a check-to-bit message array recording the second-direction passing messages respectively corresponding to the edges.

16. The decoding apparatus according to claim 15, wherein an array storage position of each of the position indexes in the position index array is determined according to a connection status of the Tanner graph, and the second-direction passing messages in the check-to-bit message array corresponding to the same bit node are adjacently arranged.

17. The decoding apparatus according to claim 15, wherein the GPGPU executes the instructions to:

read an ith position index from the position index array according to the edge identifier of the one of the threads to serve as the target position index, wherein i is equal to the edge identifier of the one of the threads.

18. The decoding apparatus according to claim 15, wherein the GPGPU executes the instructions to:

compute an updated message according to the at least one first target passing message, and substitute the updated message for a kth second-direction passing message pointed by the target position index in the check-to-bit message array, so as to update the second target passing message, wherein k is equal to the target position index.

\* \* \* \* \*